(12) United States Patent
Lu et al.

(10) Patent No.: US 11,869,624 B2
(45) Date of Patent: Jan. 9, 2024

(54) SENSE AMPLIFIER, MEMORY AND METHOD FOR CONTROLLING SENSE AMPLIFIER

(71) Applicants: ANHUI UNIVERSITY, Anhui (CN); CHANGXIN MEMORY TECHNOLOGIES, INC., Hefei (CN)

(72) Inventors: Wenjuan Lu, Hefei (CN); Yangkuo Zhao, Hefei (CN); Jun He, Hefei (CN); Xin Li, Hefei (CN); Zhan Ying, Hefei (CN); Kanyu Cao, Hefei (CN); Chunyu Peng, Hefei (CN); Xiulong Wu, Hefei (CN); Zhiting Lin, Hefei (CN); Junning Chen, Hefei (CN)

(73) Assignees: CHANGXIN MEMORY TECHNOLOGIES, INC., Hefei (CN); ANHUI UNIVERSITY, Anhui (CN)

( * ) Notice: Subject to any disclaimer, the term of this patent is extended or adjusted under 35 U.S.C. 154(b) by 255 days.

(21) Appl. No.: 17/472,805

(22) Filed: Sep. 13, 2021

(65) Prior Publication Data
US 2022/0028436 A1   Jan. 27, 2022

Related U.S. Application Data

(63) Continuation of application No. PCT/CN2020/139656, filed on Dec. 25, 2020.

(30) Foreign Application Priority Data

Jul. 27, 2020 (CN) .......................... 202010734502.2

(51) Int. Cl.
*G11C 7/02* (2006.01)
*G11C 7/08* (2006.01)
*G11C 7/12* (2006.01)

(52) U.S. Cl.
CPC . *G11C 7/08* (2013.01); *G11C 7/12* (2013.01)

(58) Field of Classification Search
CPC ......... G11C 7/08; G11C 7/12; G11C 11/4094; G11C 7/065; G11C 11/4091
(Continued)

(56) References Cited

U.S. PATENT DOCUMENTS 7,221,605 B2 *  5/2007  Forbes .................. G11C 7/065
                                                         365/207
10,950,279 B2 *  3/2021  Jeong .................... H03F 1/0205
(Continued)

FOREIGN PATENT DOCUMENTS

CN    102385900 A    3/2012
CN    105070310 A    11/2015
(Continued)

OTHER PUBLICATIONS

"Sensing Voltage Compensation Circuit for Low-Power Dram Bit-Line Sense Amplifier", 2018, Suk Min Kim, Tai Woo Oh and Seong-Ook Jung, International Conference on Electronics, Information, and Communication (ICEIC), 4 pgs.
(Continued)

*Primary Examiner* — Tha-O H Bui
(74) *Attorney, Agent, or Firm* — Cooper Legal Group, LLC

(57) ABSTRACT

A sense amplifier includes: an amplification circuit, configured to read data of a memory cell on a first bit line or a second bit line; and a first offset voltage storage cell and a second offset voltage storage cell, respectively and electrically connected to the amplification circuit, wherein in a case where the data in the memory cell on the first bit line is read, in an offset elimination stage of the sense amplifier, the sense amplifier is configured to store an offset voltage of the sense amplifier in the first offset voltage storage cell; and
(Continued)

in a case where the data in the memory cell on the second bit line is read, in the offset elimination stage of the sense amplifier, the sense amplifier is configured to store the offset voltage of the sense amplifier in the second offset voltage storage cell.

14 Claims, 16 Drawing Sheets

(58) Field of Classification Search
USPC .......................................................... 365/207
See application file for complete search history.

(56) References Cited

U.S. PATENT DOCUMENTS

| | | |
|---|---|---|
| 2004/0027892 A1 | 2/2004 | Sim |
| 2008/0101148 A1 | 5/2008 | Lee |
| 2010/0157698 A1 | 6/2010 | Barth, Jr. |
| 2018/0108399 A1 | 4/2018 | Choi |

FOREIGN PATENT DOCUMENTS

| | | |
|---|---|---|
| CN | 107481758 A | 12/2017 |
| CN | 107527637 A | 12/2017 |
| CN | 108231100 A | 6/2018 |
| CN | 109448768 A | 3/2019 |
| CN | 110390962 A | 10/2019 |
| CN | 110959176 A | 4/2020 |
| CN | 111081296 A | 4/2020 |
| CN | 210575115 U | 5/2020 |
| CN | 210606637 U | 5/2020 |
| CN | 111863052 A | 10/2020 |

OTHER PUBLICATIONS

First Office Action of the Chinese application No. 202010734502.2, dated Mar. 21, 2022, 10 pgs.

International Search Report in the international application No. PCT/CN2020/139656, dated Apr. 26, 2021, 2 pgs.

\* cited by examiner

SENSE AMPLIFIER, MEMORY AND METHOD FOR CONTROLLING SENSE AMPLIFIER

CROSS-REFERENCE TO RELATED APPLICATIONS

This application is a continuation of International Application No. PCT/CN2020/139656, filed on Dec. 25, 2020, which claims the priority to Chinese Patent Application No. 202010734502.2, filed on Jul. 27, 2020. The disclosures of International Application No. PCT/CN2020/139656 and Chinese Patent Application No. 202010734502.2 are hereby incorporated by reference in their entireties.

TECHNICAL FIELD

The disclosure relates to the technical field of semiconductor memories, and more particularly, to a Sense Amplifier (SA), a memory and a method for controlling a sense amplifier.

BACKGROUND

With the popularization of electronic devices such as mobile phones, tablets and personal computers, semiconductor memory technologies are also developed quickly. For example, memories such as the Dynamic Random Access Memory (DRAM) and Static Random-Access Memory (SRAM) have the advantages of high density, low power consumption, low price and the like, and have been widely applied to various electronic devices.

As an important part of the semiconductor memory, the sense amplifier mainly functions to amplify a small signal on a bit line, thereby executing a read or write operation.

With the continuous improvement of the technologies, the size of the semiconductor memory is increasingly reduced. In this case, the misalignment voltage caused by mismatch of transistors in the sense amplifier is increasingly large to seriously affect the performance of the semiconductor memory.

It is to be noted that the information disclosed in the background section is merely for the purpose of enhancing the understanding on the background of the disclosure and thus may include information which does not constitute related art known to those of ordinary skill in the art.

SUMMARY

An objective of the disclosure is to provide a sense amplifier, a memory and a method for controlling a sense amplifier, to at least overcome, to some extent, the problem that the performance of the semiconductor memory is affected due to mismatch of the transistor in the sense amplifier.

According to a first aspect of the disclosure, a sense amplifier is provided, which may include: an amplification module, configured to read data of a memory cell on a first bit line or a second bit line; and a first offset voltage storage cell and a second offset voltage storage cell, respectively and electrically connected to the amplification module, wherein in a case where the data in the memory cell on the first bit line is read, in an offset elimination stage of the sense amplifier, the sense amplifier is configured to store an offset voltage of the sense amplifier in the first offset voltage storage cell; and in a case where the data in the memory cell on the second bit line is read, in the offset elimination stage of the sense amplifier, the sense amplifier is configured to store the offset voltage of the sense amplifier in the second offset voltage storage cell.

According to some embodiments, the amplification module may include: a first P-channel Metal Oxide Semiconductor (PMOS) transistor; a second PMOS transistor, a source of the second PMOS transistor being connected to a source of the first PMOS transistor; a first N-channel Metal Oxide Semiconductor (NMOS) transistor, a drain of the first NMOS transistor being connected to a drain of the first PMOS transistor; and a second NMOS transistor, a drain of the second NMOS transistor being connected to a drain of the second PMOS transistor, and a source of the second NMOS transistor being connected to a source of the first NMOS transistor.

According to some embodiments, a first end of the first offset voltage storage cell is connected to the drain of the first NMOS transistor, and a second end of the first offset voltage storage cell is connected to a gate of the second NMOS transistor; and a first end of the second offset voltage storage cell is connected to a gate of the first NMOS transistor, and a second end of the second offset voltage storage cell is connected to the drain of the second NMOS transistor, wherein in the case where the data in the memory cell on the first bit line is read, in the offset elimination stage of the sense amplifier, the sense amplifier is configured to store the offset voltage of the sense amplifier in the first offset voltage storage cell; and in the case where data in the memory cell on the second bit line is read, in the offset elimination stage of the sense amplifier, the sense amplifier is configured to store the offset voltage of the sense amplifier in the second offset voltage storage cell.

According to some embodiments, in the offset elimination stage of the sense amplifier, the first PMOS transistor and the second PMOS transistor are configured as a current mirror, and the first NMOS transistor and the second NMOS transistor are both configured to be in a diode connection mode.

According to some embodiments, the drain of the first PMOS transistor and the drain of the first NMOS transistor are connected to a first node, and the drain of the second PMOS transistor and the drain of the second NMOS transistor are connected to a second node; and the sense amplifier may further include: a first switch, a first end of the first switch being connected to the first node, and a second end of the first switch being connected to the gate of the first NMOS transistor; a second switch, a first end of the second switch being connected to the second node, and a second end of the second switch being connected to the gate of the second NMOS transistor; and a third switch, a first end of the third switch being connected to the gate of the first PMOS transistor, and a second end of the third switch being connected to the gate of the second PMOS transistor, wherein in the offset elimination stage of the sense amplifier, the first switch, the second switch and the third switch are all in a closed state.

According to some embodiments, the sense amplifier may further include: a pull-up unit, configured to control a connection state of the source of the first PMOS transistor with a power voltage in response to a pull-up control signal; and a pull-down unit, configured to, in response to a pull-down control signal, control whether the source of the first NMOS transistor is grounded, wherein in the offset elimination stage of the sense amplifier, the source of the first PMOS transistor is connected to the power voltage, and the source of the first NMOS transistor is grounded.

According to some embodiments, the first switch may further include a control end, configured to control an on/off state of the first switch in response to a first control signal; the second switch may further include a control end, configured to control an on/off state of the second switch in response to a second control signal; and the third switch may further include a control end, configured to control an on/off state of the third switch in response to a third control signal.

According to some embodiments, the sense amplifier may further include: a fourth switch, a first end of the fourth switch being connected to the gate of the first NMOS transistor, and a second end of the fourth switch being connected to the second node; a fifth switch, a first end of the fifth switch being connected to the gate of the second PMOS transistor, and a second end of the fifth switch being connected to the gate of the second NMOS transistor; a sixth switch, a first end of the sixth switch being connected to the gate of the second NMOS transistor, and a second end of the sixth switch being connected to the first node; and a seventh switch, a first end of the seventh switch being connected to the gate of the first PMOS transistor, and a second end of the seventh switch being connected to the gate of the first NMOS transistor.

According to some embodiments, in the case where the data in the memory cell on the first bit line is read, in the offset elimination stage of the sense amplifier, the fifth switch is open, and the seventh switch is closed; and in the case where the data in the memory cell on the second bit line is read, in the offset elimination stage of the sense amplifier, the fifth switch is closed, and the seventh switch is open.

According to some embodiments, the fourth switch may further include a control end, configured to control an on/off state of the fourth switch in response to a fourth control signal; and the fifth switch may further include a control end, configured to control an on/off state of the fifth switch in response to a fifth control signal.

According to some embodiments, the sixth switch may further include a control end, configured to control an on/off state of the sixth switch in response to a sixth control signal; and the seventh switch may further include a control end, configured to control an on/off state of the seventh switch in response to a seventh control signal.

According to some embodiments, the sense amplifier may further include: an eighth switch, a first end of the eighth switch being connected to the first bit line, and a second end of the eighth switch being connected to the first node; and a ninth switch, a first end of the ninth switch being connected to the second bit line, and a second end of the ninth switch being connected to the second node, wherein in the offset elimination stage of the sense amplifier, both the eighth switch and the ninth switch are open.

According to some embodiments, the eighth switch may further include a control end, configured to control an on/off state of the eighth switch in response to an eighth control signal; and the ninth switch may further include a control end, configured to control an on/off state of the ninth switch in response to a ninth control signal.

According to some embodiments, after the offset elimination stage of the sense amplifier, a memory cell corresponding to the first bit line or a memory cell corresponding to the second bit line is enabled, the first switch is open, and the eighth switch and the ninth switch are closed, to input a voltage difference between the first bit line and the second bit line to the sense amplifier.

According to some embodiments, in a case where the voltage difference between the first bit line and the second bit line is input to the sense amplifier, the source of the first PMOS transistor is connected to the power voltage, and the source of the first NMOS transistor is grounded, to amplify the voltage difference.

According to some embodiments, the sense amplifier may further include: a precharge unit, configured to precharge the first bit line and the second bit line when the sense amplifier is in a precharge stage.

According to some embodiments, the precharge stage and the offset elimination stage are configured as being performed concurrently.

According to a second aspect of the disclosure, a memory is provided, which may include the above any sense amplifier.

According to a third aspect of the disclosure, a method for controlling a sense amplifier is provided. The sense amplifier may include an amplification module, a first offset voltage storage cell and a second offset voltage storage cell. The method for controlling a sense amplifier may include that: in a case where data in a memory cell on a first bit line is read, in an offset elimination stage of the sense amplifier, an offset voltage of the sense amplifier is controlled to be stored in the first offset voltage storage cell, to implement offset compensation; and in a case where data in a memory cell on a second bit line is read, in the offset elimination stage of the sense amplifier, the offset voltage of the sense amplifier is controlled to be stored in the second offset voltage storage cell, to implement the offset compensation.

In the technical solutions provided by some embodiments of the disclosure, the first offset voltage storage cell and the second offset voltage storage cell are configured in the sense amplifier, in the case where the data in the memory cell on the first bit line is read, in the offset elimination stage of the sense amplifier, the offset voltage of the sense amplifier is stored in the first offset voltage storage cell; and in the case where the data in the memory cell on the second bit line is read, in the offset elimination stage of the sense amplifier, the offset voltage of the sense amplifier is stored in the second offset voltage storage cell. On one hand, when data of a bit line needs to be read, the offset compensation of the sense amplifier may be implemented by virtue of the offset voltage stored in an offset voltage storage cell corresponding to the bit line, and the influence of the misalignment voltage on reading the data of the bit line due to the mismatch of the transistors is reduced to a great extent, thereby improving the performance of the semiconductor memory; and on the other hand, in the solutions of the disclosure, the offset compensation is implemented with the first offset voltage storage cell when the data in the memory cell on the first bit line is read, and the offset compensation is implemented with the second offset voltage storage cell when the data in the memory cell on the second bit line is read. Compared with a solution in which the offset compensation is implemented with only one offset voltage storage cell, embodiments of the disclosure avoid the problem that one offset voltage storage cell has inconsistent offset adjustment capabilities for two bit lines, thereby improving the accuracy of the offset compensation, and further improving the performance of the semiconductor memory.

It is to be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure. It is apparent that the accompanying drawings in the description below are merely some of the embodiments of the disclosure, based on which other drawings may be obtained by a person of ordinary skill in the art without any creative effort. In the drawings.

DETAILED DESCRIPTION

Figure 1:
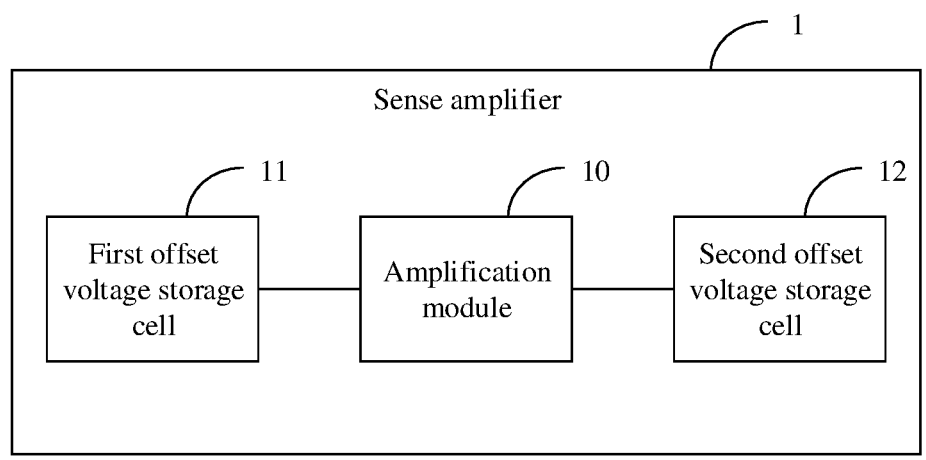
FIG. 1 schematically illustrates a block diagram of a sense amplifier according to an exemplary embodiment of the disclosure.

Exemplary embodiments will now be described more fully with reference to the accompanying drawings. However, the exemplary embodiments may be implemented in various forms and should not be understood as being limited to the examples set forth herein; rather, these embodiments are provided to make the disclosure more thorough and complete, and to fully convey the concepts of the example embodiments to those skilled in the art. The features, structures or characteristics described herein may be combined in one or more embodiments in any suitable manner. In the following description, numerous specific details are provided to offer a thorough understanding on the embodiments of the disclosure. However, it will be recognized by those skilled in the art that the technical solution of the disclosure may be practiced without one or more of the specific details, or that other methods, components, devices, steps, and the like may be employed. In other instances, well-known technical solutions are not shown or described in detail to avoid obscuring aspects of the disclosure.

In addition, the drawings are merely schematic representations of the disclosure and are not necessarily drawn to scale. The same reference numerals in the drawings denote the same or similar parts, and repetitive description thereof will be omitted. The terms "first", "second", "third", "fourth", "fifth", "sixth", "seventh", "eighth" and "ninth" are merely for distinguishing from one another and should not be taken as limits to the disclosure.

It is to be noted that the terms "connection" in the disclosure may include a direct connection and an indirect connection. In the direct connection, no component is present between ends of the connection. For example, a first end of a switch A is connected to a first end of a switch B, which may be that only a connection wire (such as a metal wire) is present on the connection line between the first end of the switch A and the first end of the switch B, while other components are not present. In the indirect connection, other components may be present between ends of the connection. For example, a first end of a switch C is connected to a first end of a switch D, which may be that at least one other component (such as a switch E), except for the connection wire, is further present on the connection line between the first end of the switch C and the first end of the switch D.

In addition, in the following description, it is to be understood by those skilled in the art that terms "offset" and "misalignment" have the same meaning, and both terms represent a deviation due to the difference between the transistors.

In the sense amplifier, due to the difference of the manufacture procedure and the influence of the working environment, transistors may vary in size, migration rate, threshold voltage and the like. The transistors are typically impossible to be the same completely in performance, which results in the misalignment of the sense amplifier, equivalent to occurrence of the misalignment noise, to seriously affect the correctness of reading data in the memory.

For example, the sense amplifier includes two symmetrically configured NMOS transistors; and in an ideal state, it is expected that the two NMOS transistors are completely the same in performance. However, as a matter of fact, threshold voltages of the two NMOS transistors may be different to cause the misalignment of the circuit. By this time, if no measures are taken, when the data is read from the memory, the original stored "1" may be read as "0" and output wrongly, or the originally stored "0" is read as "1" and output wrongly.

In order to solve the above problem, the disclosure provides a novel sense amplifier.

FIG. 1 schematically illustrates a block diagram of a sense amplifier according to an exemplary embodiment of the disclosure. As shown in FIG. 1, the sense amplifier 1 may include an amplification module 10, a first offset voltage storage cell 11 and a second offset voltage storage cell 12.

The amplification module 10 is configured to read data of a memory cell on a first bit line or a second bit line.

The first offset voltage storage cell 11 is electrically connected to the amplification module 10, and the second offset voltage storage cell 12 is electrically connected to the amplification module 10.

In a case where the data in the memory cell on the first bit line is read, in an offset elimination stage of the sense amplifier 1, the sense amplifier 1 is configured to store an offset voltage of the sense amplifier 1 in the first offset voltage storage cell 11; and in a case where the data in the memory cell on the second bit line is read, in the offset elimination stage of the sense amplifier 1, the sense amplifier 1 is configured to store the offset voltage of the sense amplifier 1 in the second offset voltage storage cell 12.

It is to be noted that the offset voltage of the sense amplifier 1 may refer to offset voltages between components included in the sense amplifier 1. That is, the offset voltage of the amplification module 10 may represent a voltage difference produced by inconsistency between at least two components in the sense amplifier 1. In a case of integrating voltage differences between all components, the offset voltage refers to an offset voltage of the whole sense amplifier 1.

The amplification module 10 may include a first PMOS transistor (hereinafter referred to as the transistor P1), a second PMOS transistor (hereinafter referred to as the transistor P2), a first NMOS transistor (hereinafter referred to as the transistor N1), and a second NMOS transistor (hereinafter referred to as the transistor N2).

In some embodiments of the disclosure, the first offset voltage storage cell 11 may be configured as one capacitor, and the second offset voltage storage cell 12 may also be configured as one capacitor. However, any device and unit having a voltage memory function may serve as the first offset voltage storage cell 11 and the second offset voltage storage cell 12 of the disclosure, and the specific configuration form is not limited by the disclosure.

Figure 2:
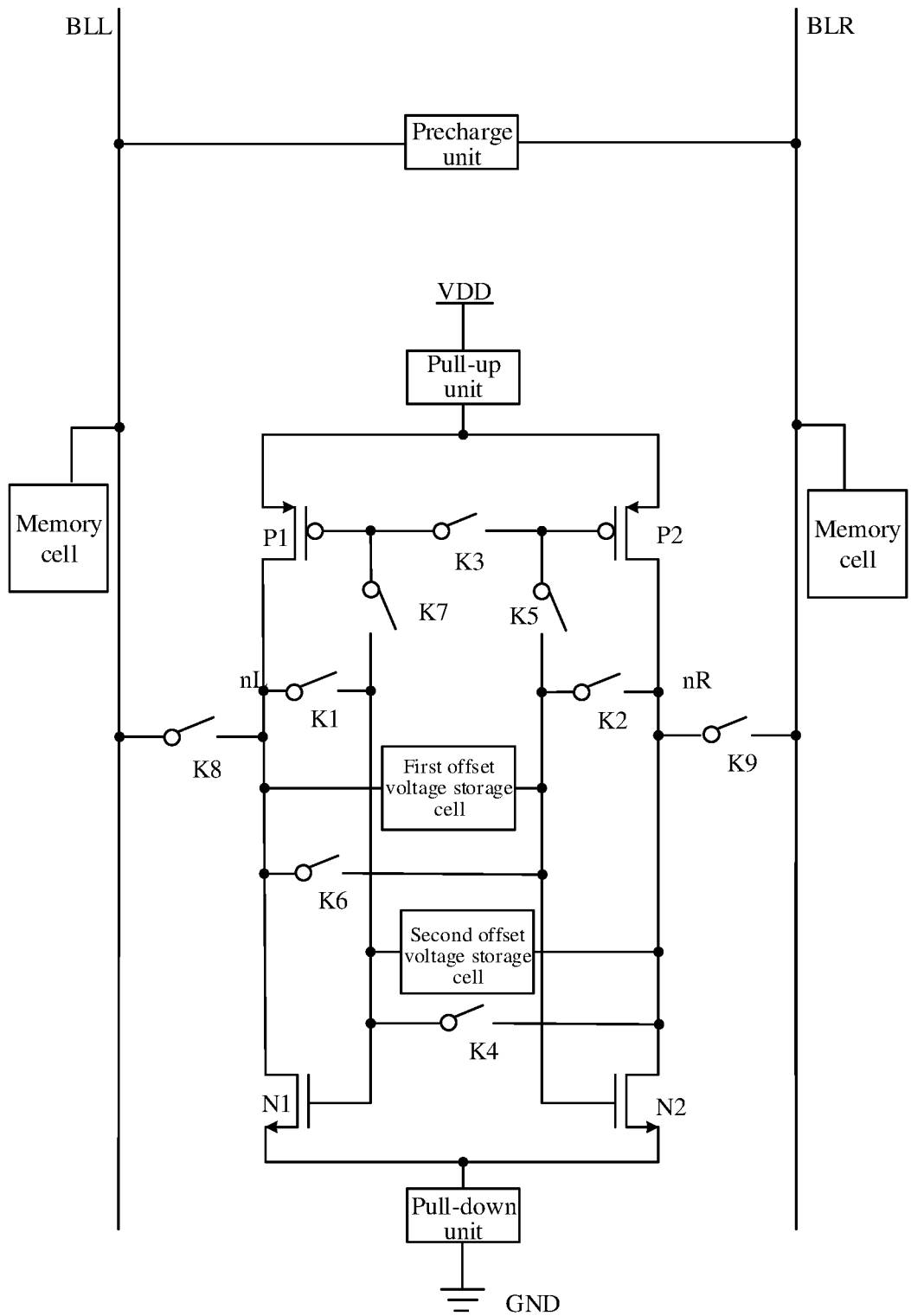
FIG. 2 schematically illustrates a circuit diagram of a sense amplifier according to an exemplary embodiment of the disclosure.

FIG. 2 schematically illustrates a circuit diagram of a sense amplifier according to an exemplary embodiment of the disclosure.

Referring to FIG. 2, a source of the transistor P1 is connected to a source of the transistor P2, and a drain of the transistor P1 is connected to a drain of the transistor N1. For the ease of subsequent description, a first node nL may be defined in the sense amplifier, and the drain of the transistor P1 and the drain of the transistor N1 are connected to the first node nL.

A drain of the transistor N2 is connected to a drain of the transistor P2, and a source of the transistor N2 is connected to a source of the transistor N1. For the ease of subsequent description, a second node nR may be defined in the sense amplifier, and the drain of the transistor N2 and the drain of the transistor P2 are connected to the second node nR.

A first end of the first offset voltage storage cell is connected to the first node nL, and a second end of the first offset voltage storage cell is connected to a gate of the transistor N2.

A first end of the second offset voltage storage cell is connected to the second node nR, and a second end of the second offset voltage storage cell is connected to a gate of the transistor N1.

In the exemplary embodiment of the disclosure, data on different bit lines is read with different policies for storing the offset voltage. Specifically, in the case where the data in the memory cell on the first bit line is read, in the offset elimination stage of the sense amplifier, the sense amplifier is configured to store the offset voltage of the sense amplifier in the first offset voltage storage cell; and in the case where data in the memory cell on the second bit line is read, in the offset elimination stage of the sense amplifier, the sense amplifier is configured to store the offset voltage of the sense amplifier in the second offset voltage storage cell.

It is to be noted that the offset voltage of the sense amplifier refers to an offset voltage of at least two transistors (or components) in the sense amplifier. Specifically, it may be an offset voltage between the transistor P1 and the transistor P2, may also be an offset voltage between the transistor N1 and the transistor N2, and may further be an offset voltage after the above two cases are integrated, which is not limited by the disclosure.

Referring to FIG. 2, in the following description, the bit line BLL is determined as the first bit line, and the bit line BLR is determined as the second bit line. However, it is to be understood that in other some embodiments of the disclosure, the bit line BLR may further be determined as the first bit line, and the bit line BLL is determined as the second bit line.

The exemplary embodiments of the disclosure will be respectively described below with respect to reading of data on different bit lines.

For a case where data in a memory cell on a bit line BLL is read

In the case where the data in the memory cell on the bit line BLL is read, the sixth switch (hereinafter referred to as the switch K6) in the sense amplifier shown in FIG. 2 is in an open state, and the seventh switch (hereinafter referred to as the switch K7) is in a closed state. A first end of the switch K6 is connected to the gate of the transistor N2, and a second end of the switch K6 is connected to the first node nL; and a first end of the switch K7 is connected to the gate of the transistor P1, and a second end of the switch K7 is connected to the gate of the transistor N1.

The working stage of the sense amplifier in the exemplary embodiment of the disclosure may be divided into: an offset elimination stage, a voltage induction stage and a voltage difference amplification stage.

In the offset elimination stage, the sense amplifier may store the offset voltage of the sense amplifier in the first offset voltage storage cell. The offset voltage is produced due to differences in size, migration rate, threshold voltage and the like of the transistors. In the voltage induction stage, the sense amplifier may inhibit the influence of the offset according to the offset voltage stored in the first offset voltage storage cell, such that the data on the bit line can be accurately read.

For the offset elimination stage of the sense amplifier, the transistor P1 and the transistor P2 may be configured as a current mirror, and the transistor N1 and the transistor N2 may be both configured to be in a diode connection mode, to store the offset voltage of the sense amplifier in the first offset voltage storage cell.

Referring to FIG. 2, the sense amplifier may further include a first switch (hereinafter referred to as the switch K1), a second switch (hereinafter referred to as the switch K2), and a third switch (hereinafter referred to as the switch K3), to implement configuration of the transistors N1, N2, P1 and P2 in the offset elimination stage of the sense amplifier.

A first end of the switch K1 is connected to the first node nL, and a second end of the switch K1 is connected to the gate of the transistor N1; a first end of the switch K2 is connected to the second node nR, and a second end of the switch K2 is connected to the gate of the transistor N2; and a first end of the switch K3 is connected to the gate of the transistor P1, and a second end of the switch K3 is connected to the gate of the transistor P2.

In the offset elimination stage of the sense amplifier, the switch K1, the switch K2 and the switch K3 are all in the closed state.

Types of the switch K1, the switch K2 and the switch K3 are not limited by the disclosure. For example, the switch K1 may be the PMOS transistor, NMOS transistor or Complementary Metal-Oxide-Semiconductor Transistor (CMOS) transmission gate; the switch K2 may be the PMOS transistor, NMOS transistor or CMOS transmission gate; and the switch K3 may be the PMOS transistor, NMOS transistor or CMOS transmission gate.

In some embodiments of the disclosure, the switch K1 may include a control end, configured to control an on/off state of the switch K1 in response to a first control signal; the switch K2 may also include a control end, configured to control an on/off state of the switch K2 in response to a second control signal; and the switch K3 may also include a control end, configured to control an on/off state of the switch K3 in response to a third control signal.

The sense amplifier in the exemplary embodiment of the disclosure may further include a pull-up unit and a pull-down unit. The pull-up unit is configured to connect the source of the transistor P1 to a power voltage VDD in response to a pull-up control signal. The pull-down unit is configured to ground the source of the transistor N1 in response to a pull-down control signal.

In an embodiment of the disclosure, the pull-up unit may include a pull-up PMOS transistor, and the pull-down unit may include a pull-down NMOS transistor. However, the pull-up unit may also be implemented with the NMOS transistor, the pull-down unit may also be implemented with the PMOS transistor, and the pull-up unit or the pull-down unit may include more than one device, and may also include multiple devices that are controlled to be turned on or off through different control signals, which is not limited by the disclosure.

Continuously referring to FIG. 2, the sense amplifier of the disclosure may further include a fourth switch (hereinafter referred to as the switch K4) and a fifth switch (hereinafter referred to as the switch K5).

A first end of the switch K4 is connected to the gate of the transistor N1, and a second end of the switch K4 is connected to the second node nR; and a first end of the switch K5 is connected to the gate of the transistor P2, and a second end of the switch K5 is connected to the gate of the transistor N2.

Similarly, types of the switch K4 and the switch K5 are not limited by the disclosure. For example, the switch K4 may be the PMOS transistor, NMOS transistor or CMOS transmission gate; and the switch K5 may be the PMOS transistor, NMOS transistor or CMOS transmission gate.

In some embodiments of the disclosure, the switch K4 may include a control end, configured to control an on/off state of the switch K4 in response to a fourth control signal; and the switch K5 may also include a control end, configured to control an on/off state of the switch K5 in response to a fifth control signal.

In the offset elimination stage of the sense amplifier, both the switch K4 and the switch K5 are in the open state.

In addition, except the above example, before the voltage induction stage, the switch K4 may further be in the closed state, which is not limited by the disclosure.

In addition, the sense amplifier of the disclosure may further include an eighth switch (hereinafter referred to as the switch K8) and a ninth switch (hereinafter referred to as the switch K9).

A first end of the switch K8 is connected to the bit line BLL, and a second end of the switch K8 is connected to the first node nL; and a first end of the switch K9 is connected to the bit line BLR, and a second end of the switch K9 is connected to the second node nR. It is to be understood by those skilled in the art that corresponding memory cells are provided on the bit line BLR and the bit line BLL respectively.

Similarly, types of the switch K8 and the switch K9 are not limited by the disclosure. For example, the switch K8 may be the PMOS transistor, NMOS transistor or CMOS transmission gate; and the switch K9 may be the PMOS transistor, NMOS transistor or CMOS transmission gate.

In some embodiments of the disclosure, the switch K8 may include a control end, configured to control an on/off state of the switch K8 in response to an eighth control signal; and the switch K9 may also include a control end, configured to control an on/off state of the switch K9 in response to the eighth control signal. That is, the control end of each of the switch K8 and the switch K9 may receive the eighth control signal.

In the offset elimination stage of the sense amplifier, both the switch K8 and the switch K9 are in the open state.

In combination with the above exemplary circuit configuration, in the offset elimination stage of the sense amplifier, the offset voltage of the sense amplifier may be stored in the first offset voltage storage cell.

In the voltage induction stage after the offset elimination stage of the sense amplifier, the memory cell corresponding to the bit line BLL is enabled, the switch K1 is open, the switch K2 and the switch K3 are open, the source of the transistor P1 and the source of the transistor P2 are disconnected from the power voltage, the source of the transistor N1 and the source of the transistor N2 are disconnected from the ground, the switch K4 and the switch K5 are closed, and the switch K8 and the switch K9 are closed, so that a voltage difference between the bit line BLR and the bit line BLL is input to the sense amplifier. As the offset voltage of the sense amplifier is stored in the first offset voltage storage cell, the voltage difference caused by inconsistency of at least two transistors in the sense amplifier may be inhibited from being wrongly amplified.

It is to be understood by those skilled in the art that the fact that the memory cell is enabled refers to that a word line of the memory cell is activated, such that data (0 or 1) stored in the memory cell is transmitted to the bit line.

In the case where the voltage difference between the bit line BLR and the bit line BLL is input to the sense amplifier, the source of the transistor P1 is connected to the power voltage, and the source of the transistor N1 is grounded, such that the sense amplifier amplifies the voltage difference.

In addition, still referring to FIG. 2, the sense amplifier in the exemplary embodiment of the disclosure may further include a precharge unit. The precharge unit is configured to precharge the bit line BLR and the bit line BLL when the sense amplifier is in a precharge stage.

As can be seen, for the sense amplifier structure in the exemplary embodiment of the disclosure, as both the switch K8 and the switch K9 are in the open state in the offset elimination stage, while the bit line BLR and the bit line BLL are precharged, the operation of storing the offset voltage of the sense amplifier to the offset voltage storage cell is not affected. Therefore, in the exemplary embodiment of the disclosure, the precharge stage and the offset elimination stage may be configured as being performed concurrently.

For a case where data in a memory cell on a bit line BLR is read

It is to be noted that in the case where the data in the memory cell on the bit line BLR is read, the switch K5 in the sense amplifier shown in FIG. 2 is in a closed state, and the switch K4 is in an open state.

The working stage of the sense amplifier in the exemplary embodiment of the disclosure may be divided into: an offset elimination stage, a voltage induction stage and a voltage difference amplification stage.

In the offset elimination stage, the sense amplifier may store the offset voltage of the sense amplifier in the second offset voltage storage cell. The offset voltage is produced due to differences in size, migration rate, threshold voltage and the like of the transistors. In the voltage induction stage, the sense amplifier may inhibit the influence of the offset according to the offset voltage stored in the second offset voltage storage cell, such that the data on the bit line can be accurately read.

For the offset elimination stage of the sense amplifier, the transistor P1 and the transistor P2 may be configured as a current mirror, and the transistor N1 and the transistor N2 may be both configured to be in a diode connection mode, to store the offset voltage of the sense amplifier in the second offset voltage storage cell.

In the offset elimination stage of the sense amplifier, the switch K1, the switch K2 and the switch K3 are all in the closed state, and the K6, the K7, the K8 and the K9 are all in the open state.

In combination with the above exemplary circuit configuration, in the offset elimination stage of the sense amplifier, the offset voltage of the sense amplifier may be stored in the second offset voltage storage cell.

In the voltage induction stage after the offset elimination stage of the sense amplifier, the memory cell corresponding to the bit line BLR is enabled, the switch K1 is open, the switch K2 and the switch K3 are open, the source of the transistor P1 and the source of the transistor P2 are disconnected from the power voltage, the source of the transistor N1 and the source of the transistor N2 are disconnected from the ground, the switch K6 and the switch K7 are closed, and the switch K8 and the switch K9 are closed, so that a voltage difference between the bit line BLR and the bit line BLL is input to the sense amplifier. As the offset voltage of the sense amplifier is stored in the second offset voltage storage cell, the voltage difference caused by inconsistency of at least two transistors in the sense amplifier may be inhibited from being wrongly amplified.

In addition, except the above example, before the voltage induction stage, the switch K6 may further be in the closed state, which is not limited by the disclosure.

In the case where the voltage difference between the bit line BLR and the bit line BLL is input to the sense amplifier, the source of the transistor P1 is connected to the power voltage, and the source of the transistor N1 is grounded, such that the sense amplifier amplifies the voltage difference.

In addition, the configuration of the precharge stage is similar to the above process of reading the data in the memory cell on the bit line BLL, and will not be repeated.

Figure 3:
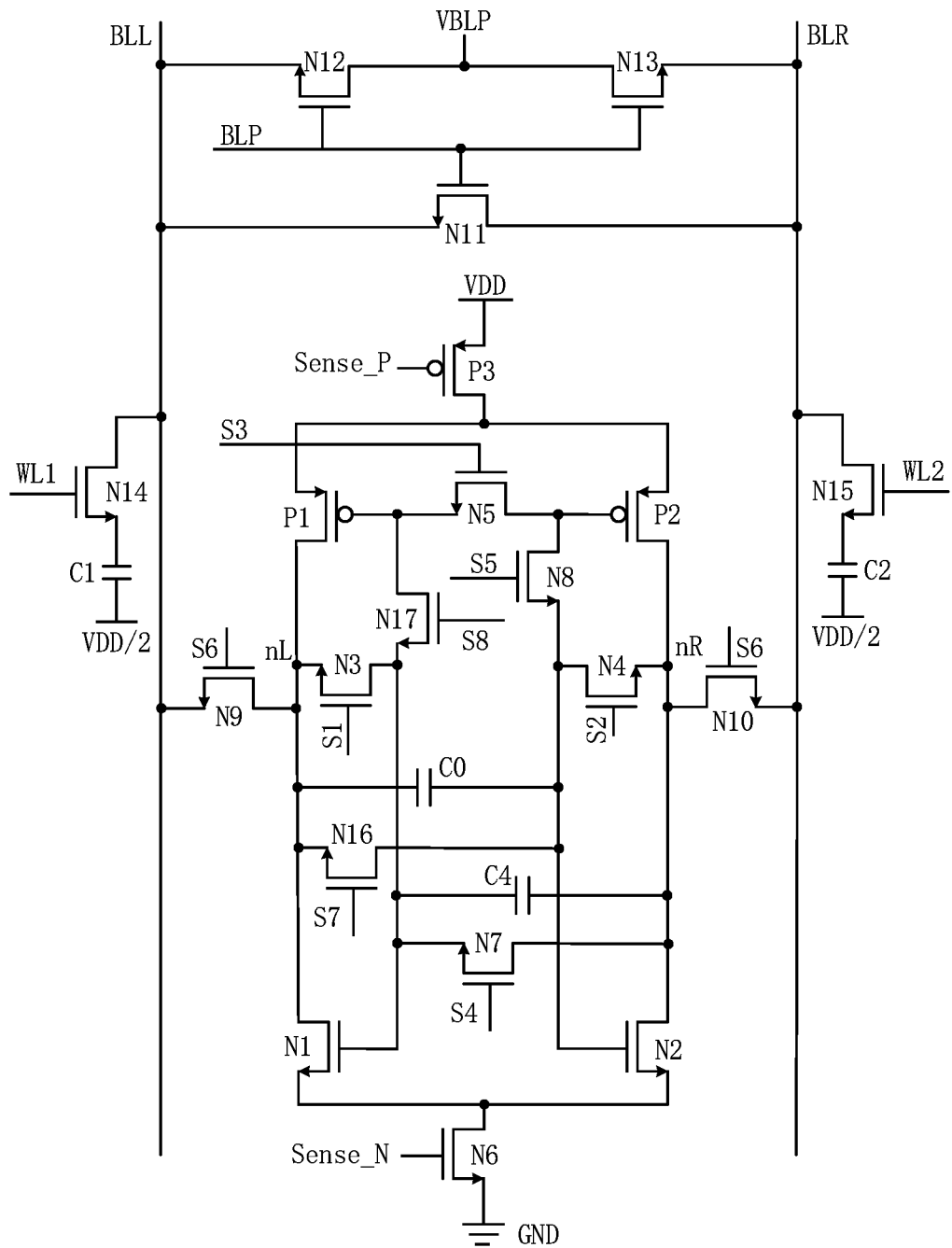
FIG. 3 schematically illustrates a circuit diagram of a specific configuration mode of a sense amplifier according to an embodiment of the disclosure.

FIG. 3 schematically illustrates a circuit diagram of a sense amplifier according to an embodiment of the disclosure.

In the example shown in FIG. 3, the first offset voltage storage cell is configured as a capacitor C0, and the second offset voltage storage cell is configured as a capacitor C4.

The switch K1 is configured as a transistor N3, which controls an on/off state in response to a first control signal S1; the switch K2 is configured as a transistor N4, which controls an on/off state in response to a second control signal S2; and the switch K3 is configured as a transistor N5, which controls an on/off state in response to a third control signal S3.

The pull-up unit is configured as a transistor P3, which controls an on/off state in response to a pull-up control signal Sense_P; and a pull-down unit is configured as a transistor N6, which controls an on/off state in response to a pull-down control signal Sense_N.

The switch K4 is configured as a transistor N7, which controls an on/off state in response to a fourth control signal S4; and the switch K5 is configured as a transistor N8, which controls an on/off state in response to a fifth control signal S5.

The switch K8 is configured as a transistor N9, which controls an on/off state in response to an eighth control signal S6; and the switch K9 is configured as a transistor N10, which controls an on/off state in response to an eighth control signal S6.

The precharge unit may include a transistor N11, a transistor N12 and a transistor N13. A gate of each of the transistor N11, the transistor N12 and the transistor N13 may receive a precharge control signal BLP. A source of the transistor N11 is connected to the bit line BLL, and a drain of the transistor N11 is connected to the bit line BLR; a source of the transistor N12 is connected to the bit line BLL, and a drain of the transistor N12 is connected to a precharge voltage VBLP, the precharge voltage VBLP being configured as VDD/2; and a source of the transistor N13 is connected to the bit line BLR, and a drain of the transistor N13 is connected to the precharge voltage VBLP.

The memory cell corresponding to the bit line BLL is configured as including a transistor N14 and a capacitor C1, and the transistor N14 controls an on/off state in response to a word line control signal WL1; and the memory cell corresponding to the bit line BLR is configured as including a transistor N15 and a capacitor C2, and the transistor N15 controls an on/off state in response to a word line control signal WL2.

In addition, the switch K6 is configured as a transistor N16, which controls an on/off state in response to a sixth control signal S7; and the switch K7 is configured as a transistor N17, which controls an on/off state in response to a seventh control signal S8.

Figure 4:
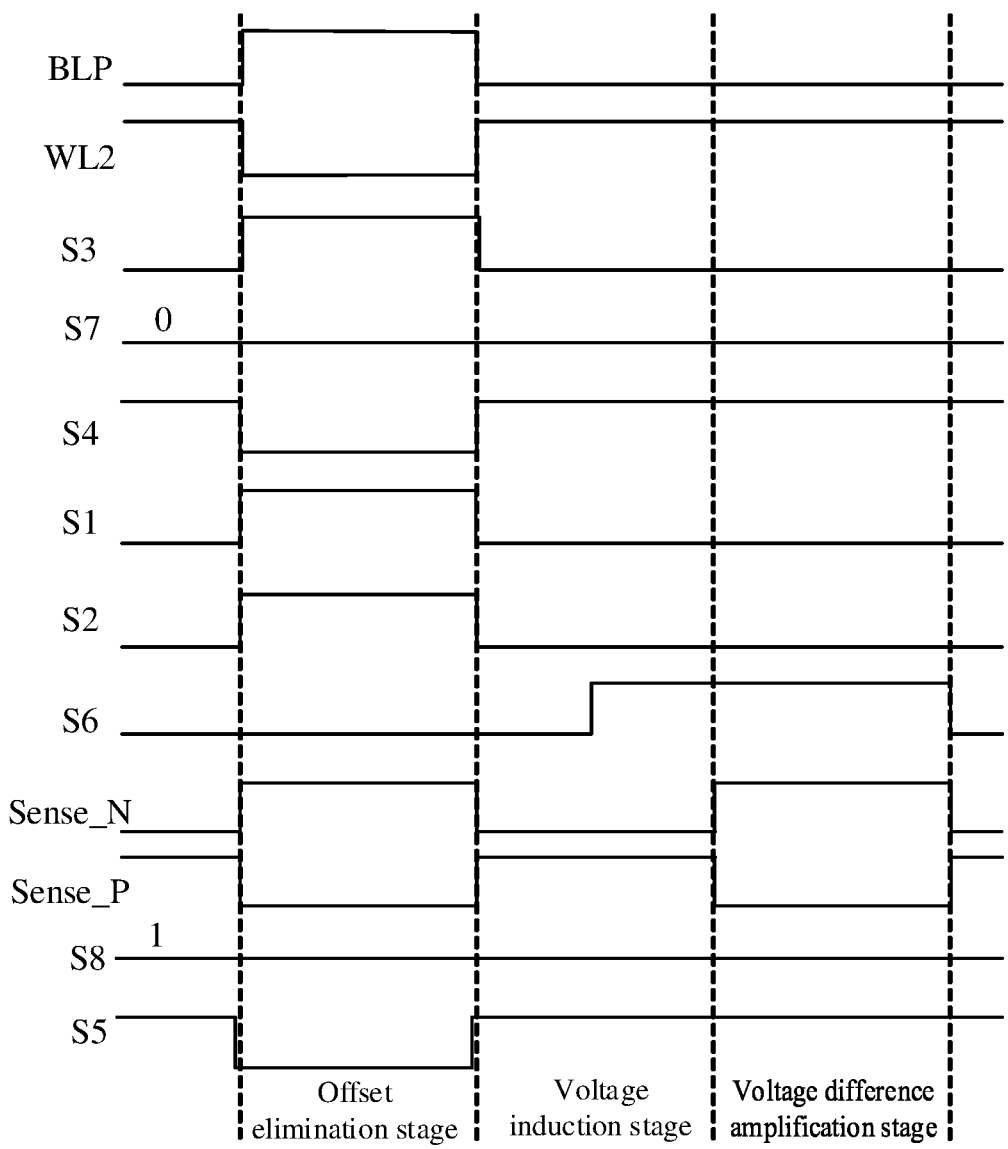
FIG. 4 schematically illustrates a sequence diagram of each control signal involved in a sense amplifier when a first bit line is read according to an embodiment of the disclosure.

FIG. 4 schematically illustrates a sequence diagram of each control signal involved in a sense amplifier when a first bit line is read according to an embodiment of the disclosure. In the process of reading the data on the first bit line, the sixth control signal S7 is always 0, and the transistor N16 is in a turned-off state (corresponding to the open state of the switch); and the seventh control signal S8 is always 1, and the transistor N17 is in a turned-on state (corresponding to the closed state of the switch).

The working stage of the sense amplifier when the first bit line BL is read in the embodiment of the disclosure will be described below in combination with the sequence diagram of FIG. 4 and with respective reference to FIG. 5, FIG. 6 and FIG. 7.

Figure 5:
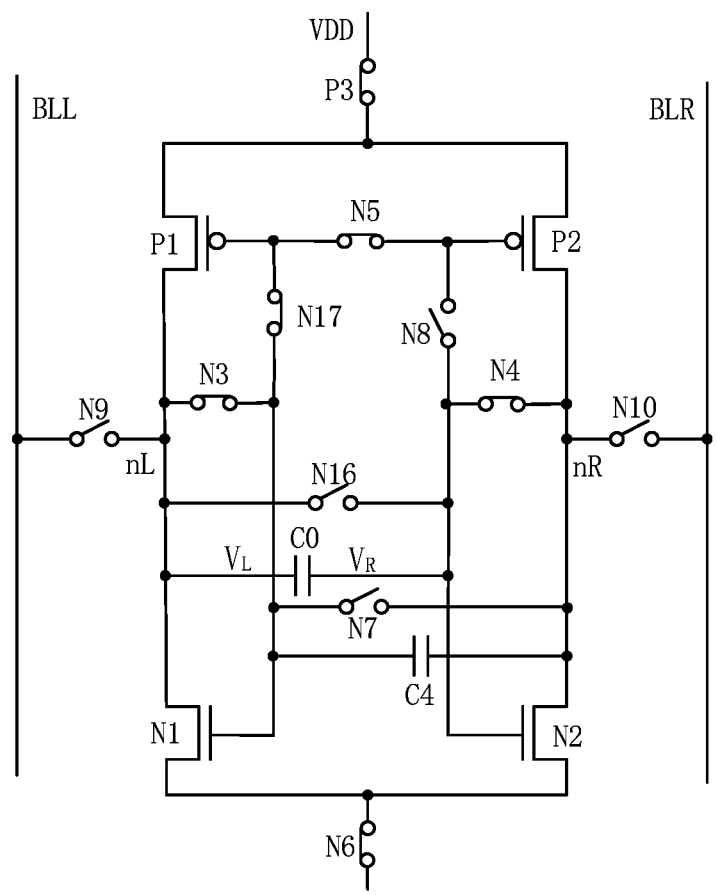
FIG. 5 schematically illustrates a circuit diagram of a sense amplifier in an offset elimination stage when a first bit line is read according to an embodiment of the disclosure.

FIG. 5 is directed to the offset elimination stage of the sense amplifier when the first bit line is read. The first control signal S1 is at the high level, and the transistor N3 is turned on; the second control signal S2 is at the high level, and the transistor N4 is turned on; and the third control signal S3 is at the high level, and the transistor N5 is turned on.

The pull-up control signal Sense_P is at the low level, and the transistor P3 is turned on; and the pull-down control signal Sense_N is at the high level, and the transistor N6 is turned on.

Therefore, the transistor P1 and the transistor P2 are configured as a current mirror, and the transistor N1 and the transistor N2 are both configured to be in a diode connection mode. In this case, the offset voltage of the sense amplifier is stored in the capacitor C0, the voltage of a side of the capacitor C0 close to the bit line BLL may be designated as $V_L$, and the voltage of a side close to the bit line BLR may be designated as $V_R$.

In addition, in the offset elimination stage, the word line control signal WL1 is at the low level, and the corresponding transistor N14 is in the turned-off state. That is, there is no to-be-read data on the bit line BLL.

The precharge control signal BLP is at the high level, that is, the precharge is performed, and the bit line BLR and the bit line BLL are precharged to the precharge voltage VBLP.

Figure 6:
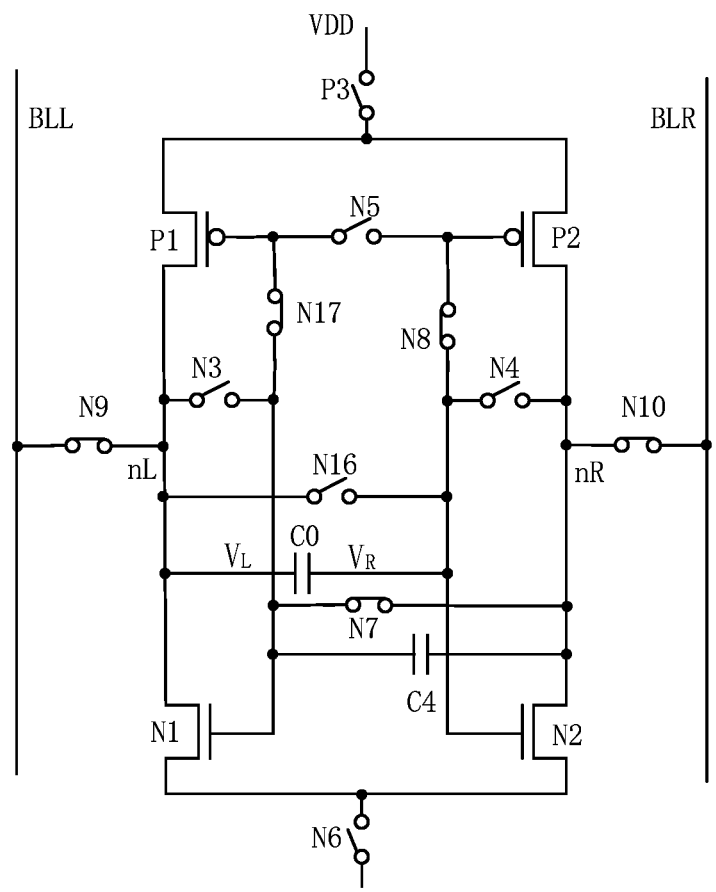
FIG. 6 schematically illustrates a circuit diagram of a sense amplifier in a voltage induction stage when a first bit line is read according to an embodiment of the disclosure.

FIG. 6 is directed to the voltage induction stage of the sense amplifier. The first control signal S1 is at the low level, and the transistor N3 is turned off; the second control signal S2 is at the low level, and the transistor N4 is turned off; the third control signal S3 is at the low level, and the transistor N5 is turned off; the fourth control signal S4 is at the high level, and the transistor N7 is turned on; the fifth control signal S5 is at the high level, and the transistor N8 is turned on; and the eighth control signal S6 is continuously at the low level and then jumps to the high level, the transistor N9 and the transistor N10 are in the turned-off state first and then are turned on.

The pull-up control signal Sense_P is at the high level, and the transistor P3 is turned off; and the pull-down control signal Sense_N is at the low level, and the transistor N6 is turned off.

In addition, the precharge control signal BLP is at the low level, and the precharge ends.

First of all, the word line control signal WL1 is at the high level, the transistor N14 is turned on, and the data stored in the capacitor C1 is transmitted to the bit line. Due to the influence of the data on the bit line, a relatively small voltage difference is formed between the bit line BLR and the bit line BLL.

Next, the eighth control signal S6 jumps to the high level, and the transistor N9 and the transistor N10 are turned on, such that the relatively small voltage difference is transferred to the inside of the sense amplifier. Due to the capacitor C0, the voltage actually transferred to the gate of the transistor N2 is $V_{BLL}+V_L$, where the $V_{BLL}$ is the voltage on the bit line BLL. Therefore, the voltage difference due to inconsistency of at least two transistors in the sense amplifier is inhibited from being wrongly amplified to reduce the read error rate.

Figure 7:
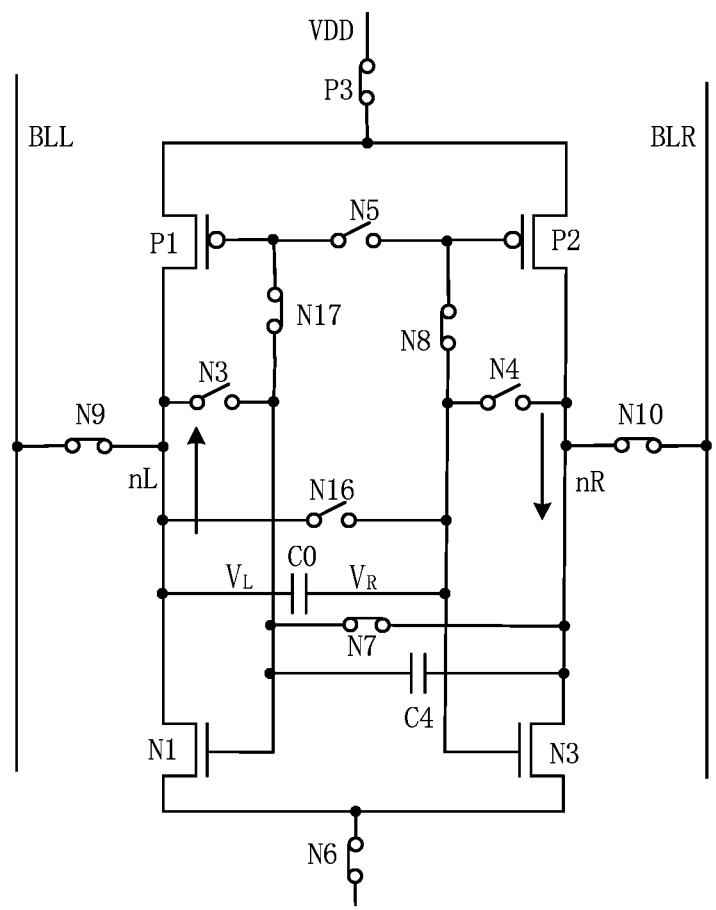
FIG. 7 schematically illustrates a circuit diagram of a sense amplifier in a voltage difference amplification stage when a first bit line is read according to an embodiment of the disclosure.

FIG. 7 is directed to the voltage amplification stage of the sense amplifier. Referring to the sequence diagram of FIG. 4, compared with the voltage induction stage, the pull-up control signal Sense_P is at the low level, and the transistor P3 is turned on; and the pull-down control signal Sense_N is at the high level, and the transistor N6 is turned on.

In this case, the transistor P1, the transistor P2, the transistor N1 and the transistor N2 are formed into a positive feedback circuit for two cross-coupling phase inverters, such that the voltage difference on the bit line may be quickly amplified, and written back to the corresponding memory cell.

Through the sense amplifier configuration mode in the exemplary embodiment of the disclosure, the offset compensation of the sense amplifier may be implemented, and the influence of the misalignment voltage to read the data of the bit line due to the mismatch of the transistor is reduced to a great extent, thereby improving the performance of the semiconductor memory.

In addition, in other some embodiments of the disclosure, between the offset elimination stage and the voltage induction stage of the sense amplifier, there may be a voltage balance stage that makes the voltage of the first node nL be consistent with the voltage of the second node nR.

Figure 8:
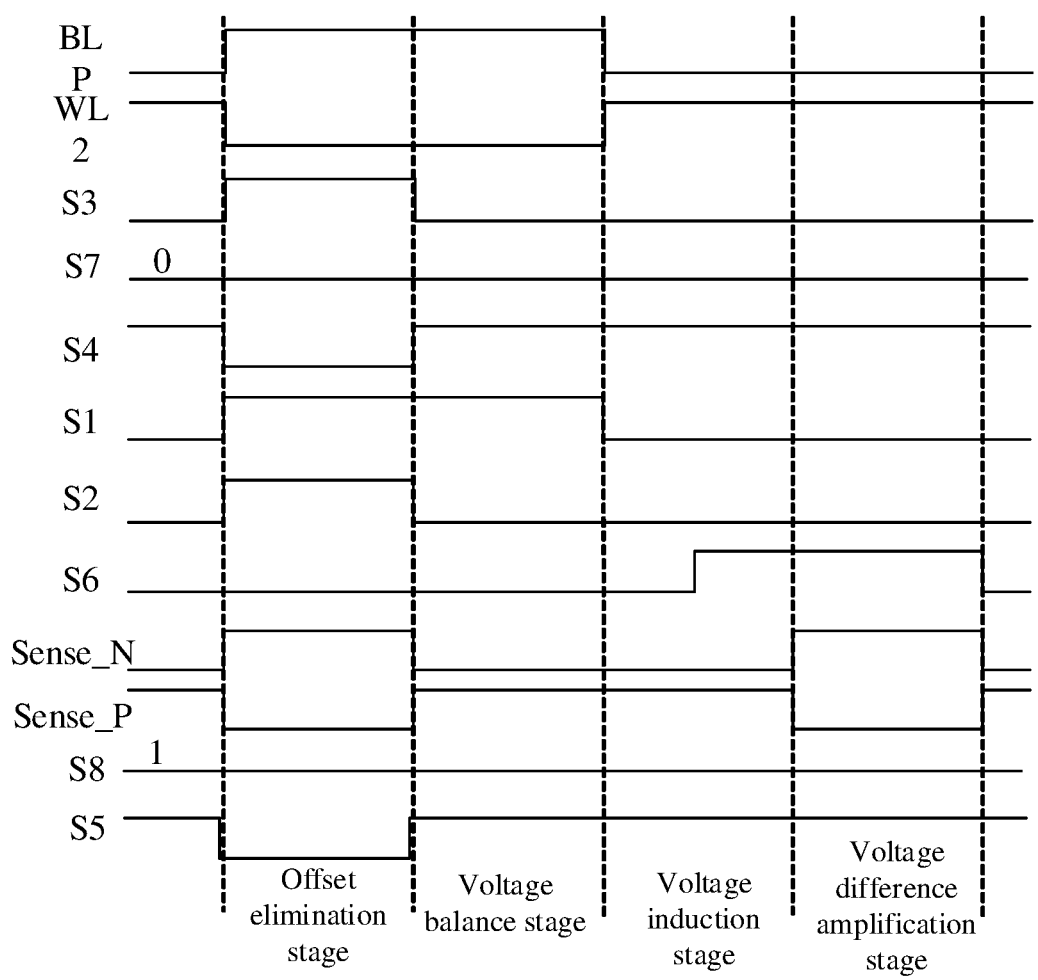
FIG. 8 schematically illustrates a sequence diagram of each control signal involved in a sense amplifier when a first bit line is read according to another embodiment of the disclosure.

FIG. 8 illustrates a sequence diagram of each control signal when a voltage balance stage is included.

Figure 9:
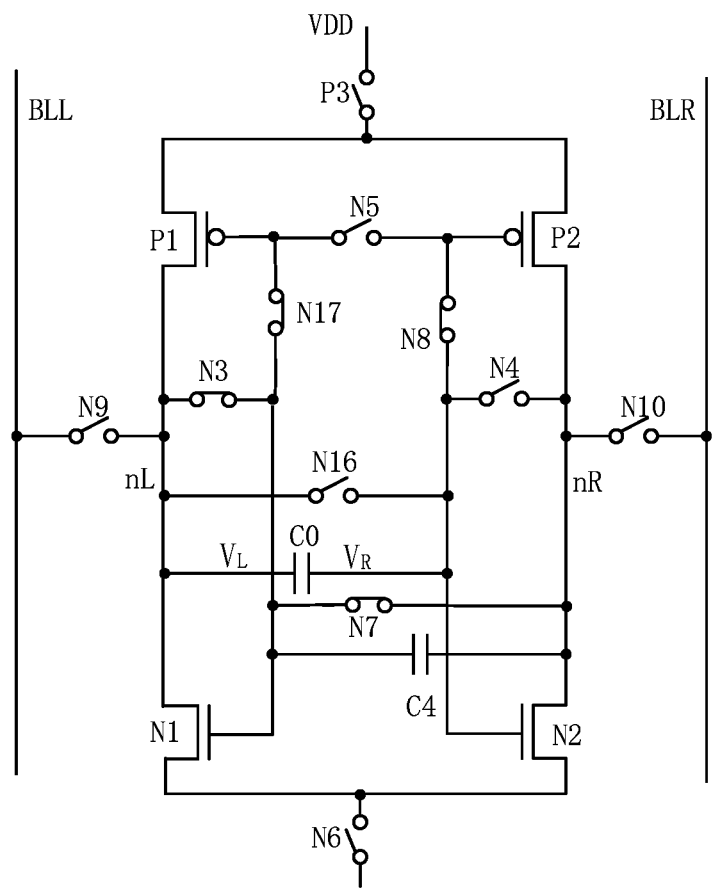
FIG. 9 schematically illustrates a circuit diagram of a sense amplifier in a voltage balance stage when a first bit line is read according to an embodiment of the disclosure.

The voltage balance stage of the sense amplifier when the first bit line is read in other some embodiments will be described in combination with the sequence diagram of FIG. 8 and with reference to FIG. 9.

Compared with the offset elimination stage, in the voltage balance stage of the sense amplifier, the second control signal S2 is at the low level, and the transistor N4 is turned off; the third control signal S3 is at the low level, and the transistor N5 is turned off; the fourth control signal S4 is at the high level, and the transistor N7 is turned on; and the fifth control signal S5 is at the high level, the transistor N8 is turned on.

The pull-up control signal Sense_P is at the high level, and the transistor P3 is turned off; and the pull-down control signal Sense_N is at the low level, and the transistor N6 is turned off.

Therefore, the voltage of the first node nL in the sense amplifier is consistent with the voltage of the second node nR, thereby balancing charges, and eliminating the influence on data reading due to the voltage difference formed in the offset elimination stage.

In the embodiment including the voltage balance stage, the precharge stage may be implemented when the offset elimination stage is implemented, or, the re-charging stage may be implemented when the voltage balance stage is implemented, or, the re-charging stage may be implemented when the offset elimination stage and the voltage balance stage are implemented.

Figure 10:
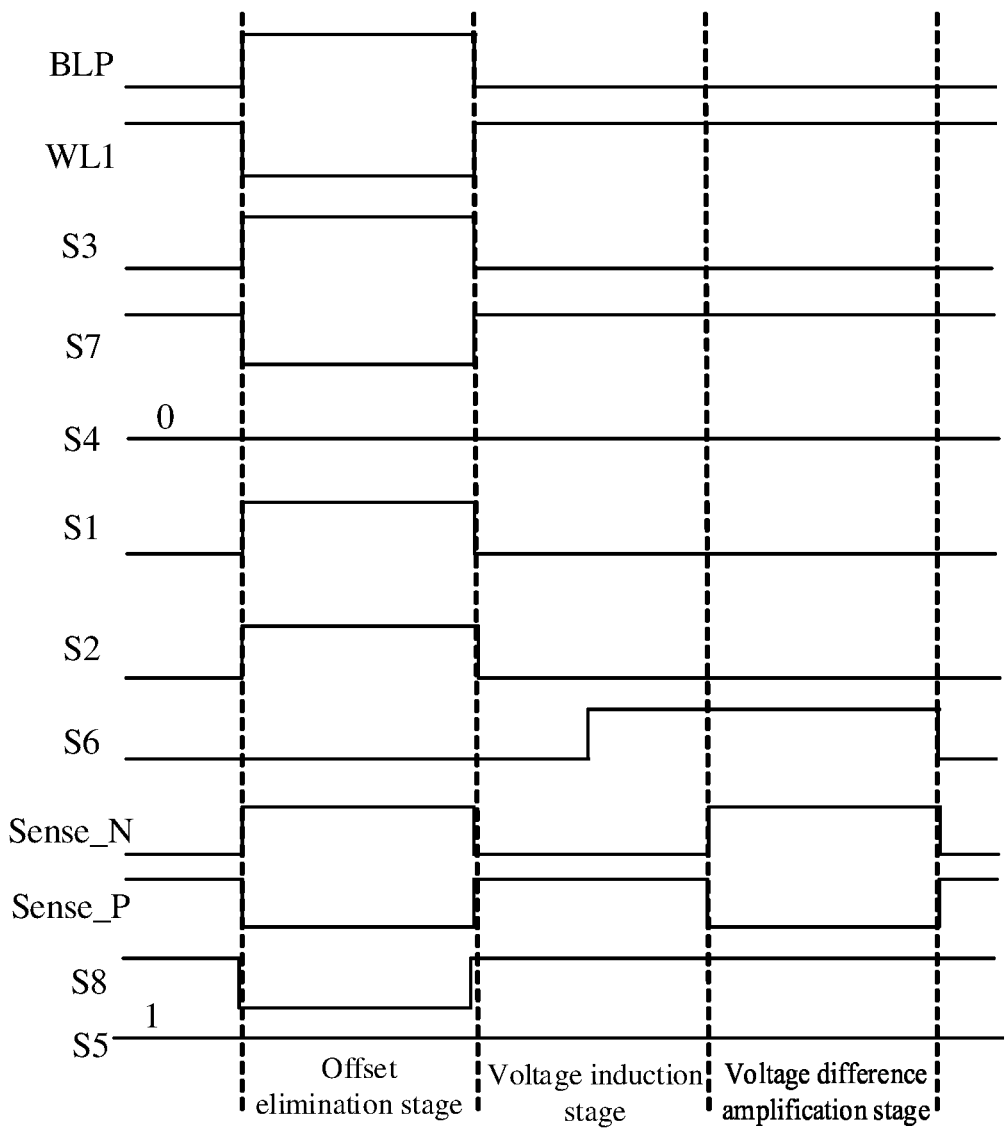
FIG. 10 schematically illustrates a sequence diagram of each control signal involved in a sense amplifier when a second bit line is read according to an embodiment of the disclosure.

FIG. 10 schematically illustrates a sequence diagram of each control signal involved in a sense amplifier when a second bit line is read according to an embodiment of the disclosure. In the process of reading the data on the second bit line, the fourth control signal S4 is always 0, and the transistor N7 is in a turned-off state; and the fifth control signal S5 is always 1, and the transistor N8 is in a turned-on state.

The working stage of the sense amplifier when the second bit line BL is read in the embodiment of the disclosure will be described below in combination with the sequence diagram of FIG. 10 and with respective reference to FIG. 11, FIG. 12 and FIG. 13.

Figure 11:
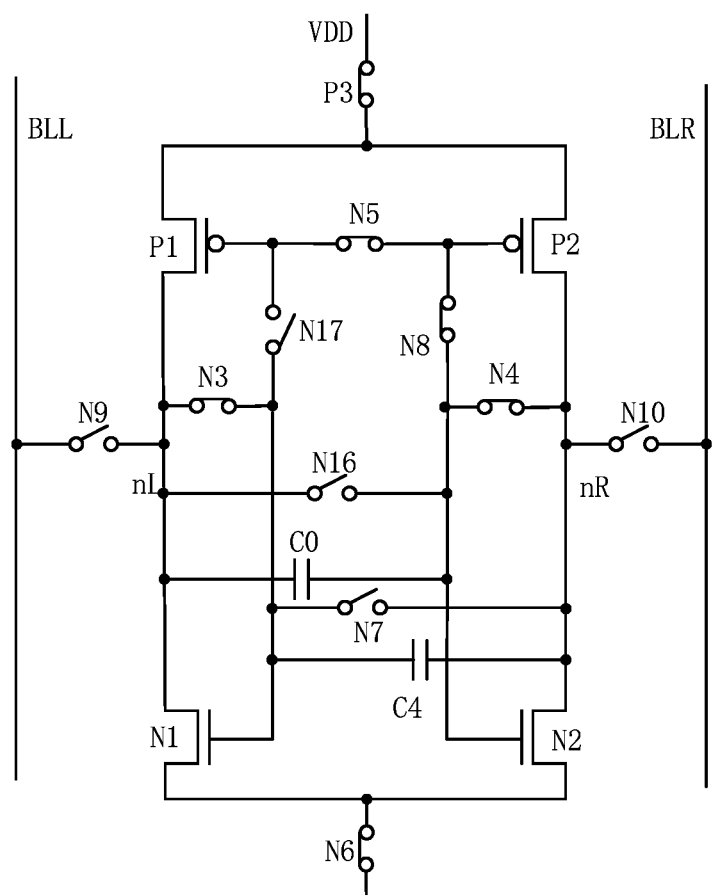
FIG. 11 schematically illustrates a circuit diagram of a sense amplifier in an offset elimination stage when a second bit line is read according to an embodiment of the disclosure.

FIG. 11 is directed to the offset elimination stage of the sense amplifier when the second bit line is read. The first control signal S1 is at the high level, and the transistor N3 is turned on; the second control signal S2 is at the high level, and the transistor N4 is turned on; and the third control signal S3 is at the high level, and the transistor N5 is turned on.

The pull-up control signal Sense_P is at the low level, and the transistor P3 is turned on; and the pull-down control signal Sense_N is at the high level, and the transistor N6 is turned on.

Therefore, the transistor P1 and the transistor P2 are configured as a current mirror, and the transistor N1 and the transistor N2 are both configured to be in a diode connection mode. In this case, the offset voltage of the sense amplifier is stored in the capacitor C4, the voltage of a side of the capacitor C4 close to the bit line BLL may be designated as $V_L$, and the voltage of a side close to the bit line BLR may be designated as $V_R$.

In addition, in the offset elimination stage, the word line control signal WL2 is at the low level, and the corresponding transistor N15 is in the turned-off state. That is, there is no to-be-read data on the bit line BLR.

The precharge control signal BLP is at the high level, that is, the precharge is performed, and the bit line BLR and the bit line BLL are precharged to the precharge voltage VBLP.

Figure 12:
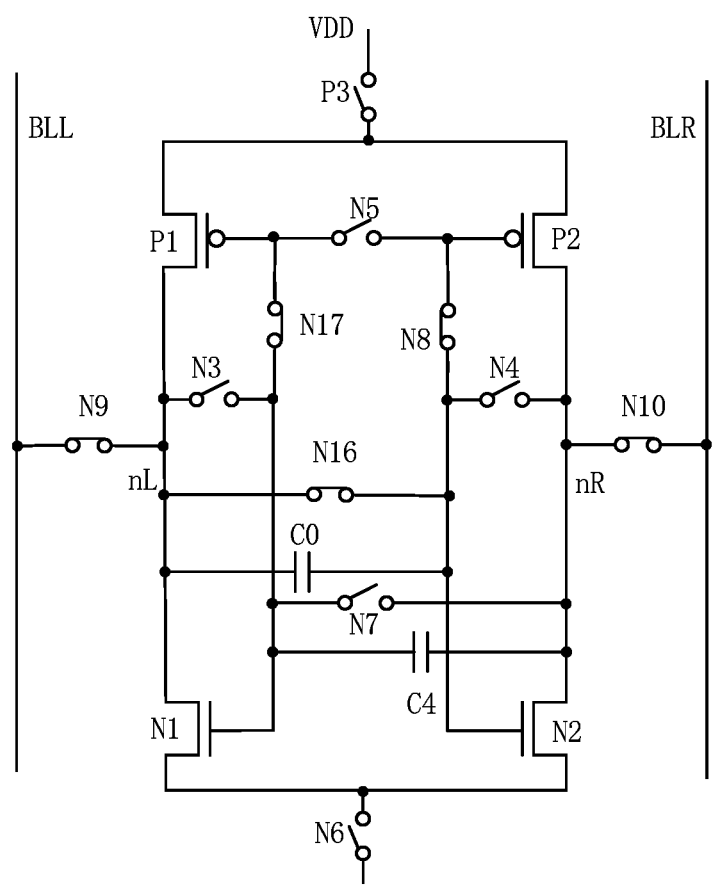
FIG. 12 schematically illustrates a circuit diagram of a sense amplifier in a voltage induction stage when a second bit line is read according to an embodiment of the disclosure.

FIG. 12 is directed to the voltage induction stage of the sense amplifier. The first control signal S1 is at the low level, and the transistor N3 is turned off; the second control signal S2 is at the low level, and the transistor N4 is turned off; the third control signal S3 is at the low level, and the transistor N5 is turned off; the sixth control signal S7 is at the high level, and the transistor N16 is turned on; the seventh control signal S8 is at the high level, and the transistor N17 is turned on; and the eighth control signal S6 is continuously at the low level and then jumps to the high level, the transistor N9 and the transistor N10 are in the turned-off state first and then are turned on.

The pull-up control signal Sense_P is at the high level, and the transistor P3 is turned off; and the pull-down control signal Sense_N is at the low level, and the transistor N6 is turned off.

In addition, the precharge control signal BLP is at the low level, and the precharge ends.

First of all, the word line control signal WL2 is at the high level, the transistor N15 is turned on, and the data stored in the capacitor C2 is transmitted to the bit line. Due to the influence of the data on the bit line, a relatively small voltage difference is formed between the bit line BLR and the bit line BLL.

Next, the eighth control signal S6 jumps to the high level, and the transistor N9 and the transistor N10 are turned on, such that the relatively small voltage difference is transferred to the inside of the sense amplifier. Due to the capacitor C4, the voltage actually transferred to the gate of the transistor N1 is $V_{BLR}+V_L-V_R$, wherein the $V_{BLR}$ is the voltage on the bit line BLR. Therefore, the voltage difference due to inconsistency of at least two transistors in the sense amplifier is inhibited from being wrongly amplified to reduce the read error rate.

Figure 13:
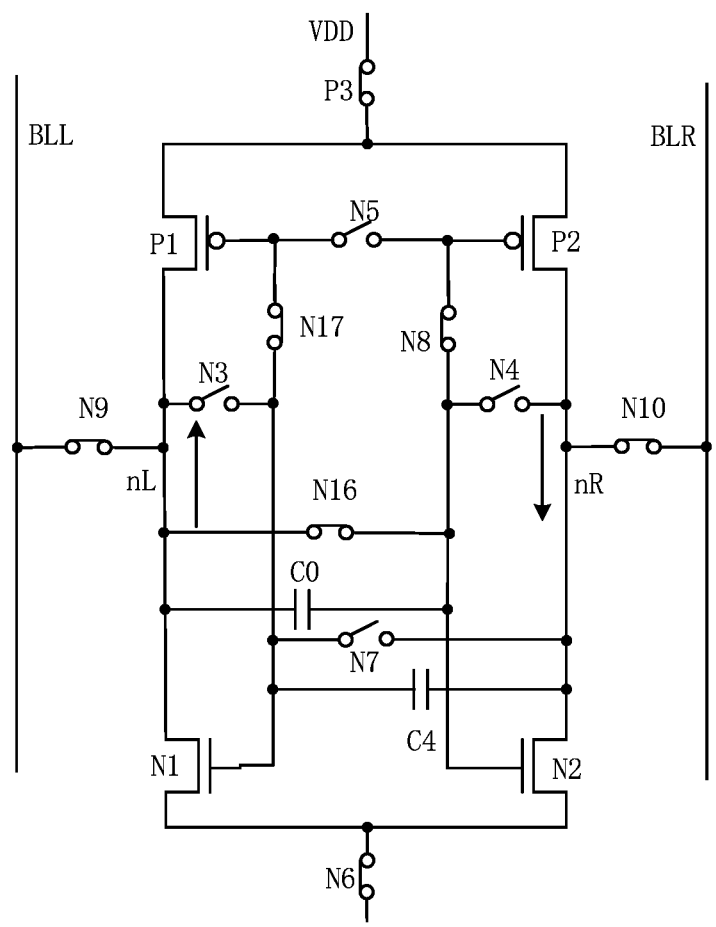
FIG. 13 schematically illustrates a circuit diagram of a sense amplifier in a voltage difference amplification stage when a second bit line is read according to an embodiment of the disclosure.

FIG. 13 is directed to the voltage amplification stage of the sense amplifier. Referring to the sequence diagram of FIG. 10, compared with the voltage induction stage, the pull-up control signal Sense_P is at the low level, and the transistor P3 is turned on; and the pull-down control signal Sense_N is at the high level, and the transistor N6 is turned on.

In this case, the transistor P1, the transistor P2, the transistor N1 and the transistor N2 are formed into a positive feedback circuit for two cross-coupling phase inverters, such that the voltage difference on the bit line may be quickly amplified, and written back to the corresponding memory cell.

Through the sense amplifier configuration mode in the exemplary embodiment of the disclosure, the offset compensation of the sense amplifier may be implemented, and the influence of the misalignment voltage to read the data of the bit line due to the mismatch of the transistor is reduced to a great extent, thereby improving the performance of the semiconductor memory.

In addition, in other some embodiments of the disclosure, between the offset elimination stage and the voltage induction stage of the sense amplifier, there may be a voltage balance stage that makes the voltage of the first node nL consistent with the voltage of the second node nR.

Figure 14:
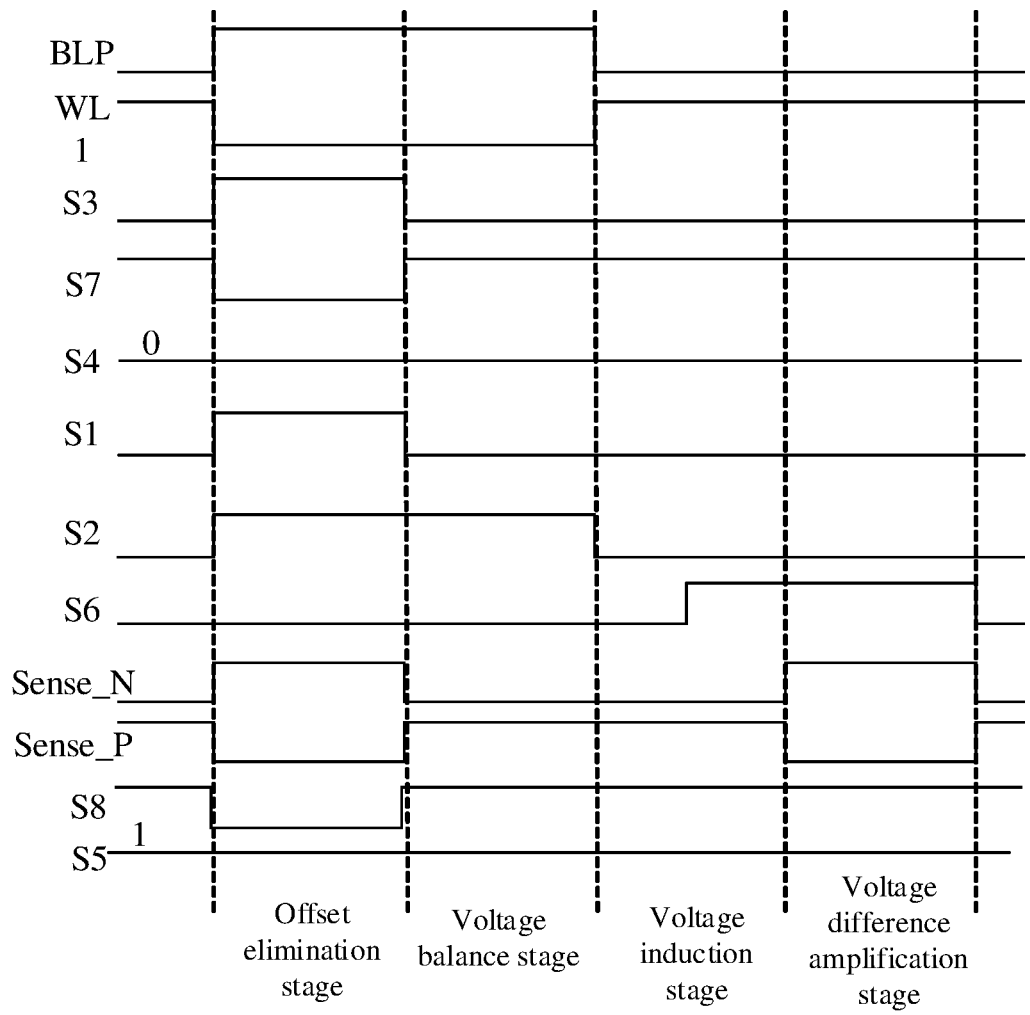
FIG. 14 schematically illustrates a sequence diagram of each control signal involved in a sense amplifier when a second bit line is read according to another embodiment of the disclosure.

FIG. 14 illustrates a sequence diagram of each control signal when a voltage balance stage is included.

Figure 15:
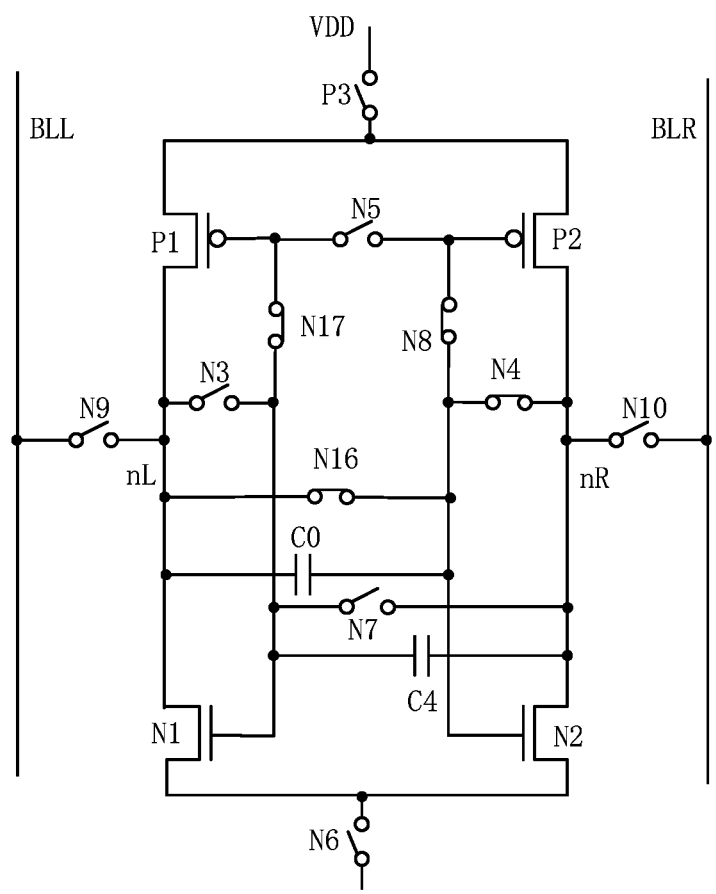
FIG. 15 schematically illustrates a circuit diagram of a sense amplifier in a voltage balance stage when a second bit line is read according to an embodiment of the disclosure.

The voltage balance stage of the sense amplifier when the second bit line is read in other some embodiments will be described in combination with the sequence diagram of FIG. 14 and with reference to FIG. 15.

Compared with the offset elimination stage, in the voltage balance stage of the sense amplifier, the first control signal S1 is at the low level, and the transistor N3 is turned off; the third control signal S3 is at the low level, and the transistor N5 is turned off; the sixth control signal S7 is at the high level, and the transistor N16 is turned on; and the seventh control signal S8 is at the high level, and the transistor N17 is turned on.

The pull-up control signal Sense_P is at the high level, and the transistor P3 is turned off; and the pull-down control signal Sense_N is at the low level, and the transistor N6 is turned off.

Therefore, the voltage of the first node nL in the sense amplifier is consistent with the voltage of the second node nR, thereby balancing charges, and eliminating the influence on data reading due to the voltage difference formed in the offset elimination stage.

In the embodiment including the voltage balance stage, the precharge stage may be implemented when the offset elimination stage is implemented, or, the re-charging stage may be implemented when the voltage balance stage is implemented.

Based on the sense amplifier in the exemplary embodiment of the disclosure, on one hand, when data of a bit line needs to be read, the offset compensation of the sense amplifier may be implemented by virtue of the offset voltage stored in an offset voltage storage cell corresponding to the bit line, and the influence of the misalignment voltage on reading the data of the bit line due to the mismatch of the transistors is reduced to a great extent, thereby improving the performance of the semiconductor memory; and on the other hand, in the solutions of the disclosure, the offset compensation is implemented with the first offset voltage storage cell when the data in the memory cell on the first bit line is read, and the offset compensation is implemented with the second offset voltage storage cell when the data in the memory cell on the second bit line is read. Compared with a solution in which the offset compensation is implemented with only one offset voltage storage cell, embodiments of the disclosure avoid the problem that one offset voltage storage cell has inconsistent offset adjustment capabilities for two bit lines, thereby improving the accuracy of the offset compensation, and further improving the performance of the semiconductor memory.

Further, the disclosure further provides a method for controlling a sense amplifier.

Figure 16:
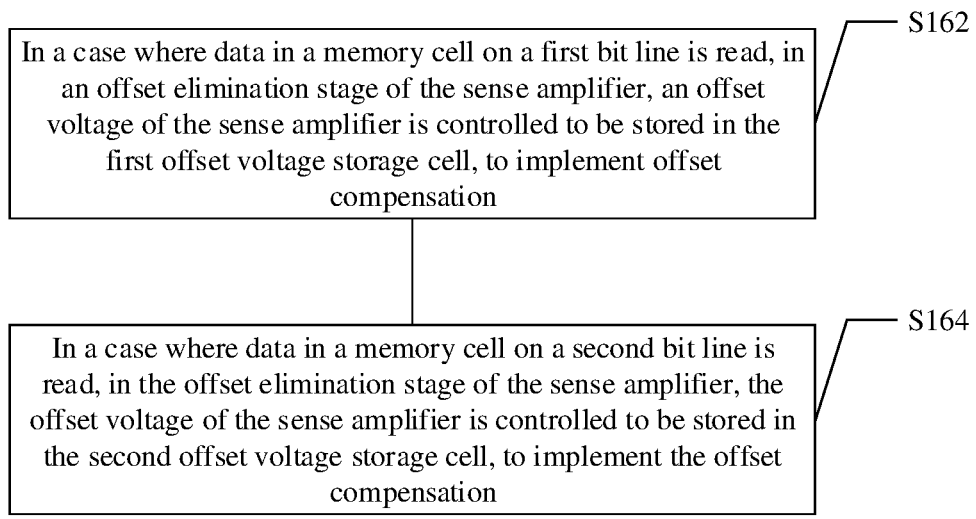
FIG. 16 schematically illustrates a flowchart of a method for controlling a sense amplifier according to an exemplary embodiment of the disclosure.

FIG. 16 schematically illustrates a flowchart of a method for controlling a sense amplifier according to an exemplary embodiment of the disclosure. As mentioned above, the sense amplifier may include an amplification module, a first offset voltage storage cell and a second offset voltage storage cell.

Referring to FIG. 16, the method for controlling a sense amplifier may include the following steps.

In S162, in a case where data in a memory cell on a first bit line is read, in an offset elimination stage of the sense amplifier, an offset voltage of the sense amplifier is controlled to be stored in the first offset voltage storage cell, to implement offset compensation.

In S164, in a case where data in a memory cell on a second bit line is read, in the offset elimination stage of the sense amplifier, the offset voltage of the sense amplifier is controlled to be stored in the second offset voltage storage cell, to implement the offset compensation.

As mentioned above, the sense amplifier may further include a voltage difference amplification stage, to amplify a voltage difference on the bit line, and write the voltage back to the memory cell. In addition, in other some embodiments, the sense amplifier may further include a voltage balance stage. Details have been described in the above process of configuring the sense amplifier, and will not be repeated herein.

Through the method for controlling a sense amplifier in the exemplary embodiment of the disclosure, the offset compensation of the sense amplifier may be implemented by virtue of the offset voltage stored in the offset voltage storage cell, and the influence of the misalignment voltage to read the data of the bit line due to the mismatch of the transistor is reduced to a great extent, thereby improving the performance of the semiconductor memory.

Further, the disclosure further provides a memory. The memory may include the above sense amplifier.

With the sense amplifier in the exemplary embodiment of the disclosure, the read error rate of the memory is reduced, the read speed is improved, and the read power consumption is reduced. Therefore, the performance of the memory is greatly improved.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the disclosure as come within known or customary practice in the art. The specification and examples be considered as exemplary only, with a true scope and spirit of the disclosure being indicated by the claims.

It will be appreciated that the disclosure is not limited to the exact construction that has been described above and illustrated in the accompanying drawings, and that various modifications and changes may be made without departing from the scope thereof. The scope of the disclosure only be limited by the appended claims.

The invention claimed is:

1. A sense amplifier, comprising:
an amplification circuit, configured to read data of a memory cell on a first bit line or a second bit line; and
a first offset voltage storage cell and a second offset voltage storage cell, respectively and electrically connected to the amplification circuit,
wherein in a case where the data in the memory cell on the first bit line is read, in an offset elimination stage of the sense amplifier, the sense amplifier is configured to store an offset voltage of the sense amplifier in the first offset voltage storage cell; and in a case where the data in the memory cell on the second bit line is read, in the offset elimination stage of the sense amplifier, the sense amplifier is configured to store the offset voltage of the sense amplifier in the second offset voltage storage cell,
wherein the amplification circuit comprises:
a first Positive channel Metal Oxide Semiconductor (PMOS) transistor;
a second PMOS transistor, a source of the second PMOS transistor being connected to a source of the first PMOS transistor;
a first Negative channel Metal Oxide Semiconductor (NMOS) transistor, a drain of the first NMOS transistor being connected to a drain of the first PMOS transistor; and
a second NMOS transistor, a drain of the second NMOS transistor being connected to a drain of the second PMOS transistor, and a source of the second NMOS transistor being connected to a source of the first NMOS transistor,
wherein a first end of the first offset voltage storage cell is connected to the drain of the first NMOS transistor, and a second end of the first offset voltage storage cell is connected to a gate of the second NMOS transistor,
wherein a first end of the second offset voltage storage cell is connected to a gate of the first NMOS transistor, and a second end of the second offset voltage storage cell is connected to the drain of the second NMOS transistor, and
wherein in the offset elimination stage of the sense amplifier, the first PMOS transistor and the second PMOS transistor are configured as a current mirror, and the first NMOS transistor and the second NMOS transistor are both configured to be in a diode connection mode.

2. The sense amplifier of claim 1, wherein the drain of the first PMOS transistor and the drain of the first NMOS transistor are connected to a first node, and the drain of the second PMOS transistor and the drain of the second NMOS transistor are connected to a second node; and the sense amplifier further comprises:
a first switch, a first end of the first switch being connected to the first node, and a second end of the first switch being connected to the gate of the first NMOS transistor;
a second switch, a first end of the second switch being connected to the second node, and a second end of the second switch being connected to the gate of the second NMOS transistor; and
a third switch, a first end of the third switch being connected to a gate of the first PMOS transistor, and a second end of the third switch being connected to a gate of the second PMOS transistor,
wherein in the offset elimination stage of the sense amplifier, the first switch, the second switch and the third switch are all in a closed state.

3. The sense amplifier of claim 2, further comprising:
a pull-up circuit, configured to control a connection state of the source of the first PMOS transistor with a power voltage in response to a pull-up control signal; and
a pull-down circuit, configured to, in response to a pull-down control signal, control whether the source of the first NMOS transistor is grounded,
wherein in the offset elimination stage of the sense amplifier, the source of the first PMOS transistor is connected to the power voltage, and the source of the first NMOS transistor is grounded.

4. The sense amplifier of claim 3, further comprising:
a fourth switch, a first end of the fourth switch being connected to the gate of the first NMOS transistor, and a second end of the fourth switch being connected to the second node;
a fifth switch, a first end of the fifth switch being connected to the gate of the second PMOS transistor, and a second end of the fifth switch being connected to the gate of the second NMOS transistor;
a sixth switch, a first end of the sixth switch being connected to the gate of the second NMOS transistor, and a second end of the sixth switch being connected to the first node; and
a seventh switch, a first end of the seventh switch being connected to the gate of the first PMOS transistor, and a second end of the seventh switch being connected to the gate of the first NMOS transistor.

5. The sense amplifier of claim 4, wherein in the case where the data in the memory cell on the first bit line is read, in the offset elimination stage of the sense amplifier, the fifth switch is open, and the seventh switch is closed; and
in the case where the data in the memory cell on the second bit line is read, in the offset elimination stage of the sense amplifier, the fifth switch is closed, and the seventh switch is open.

6. The sense amplifier of claim 5, further comprising:
an eighth switch, a first end of the eighth switch being connected to the first bit line, and a second end of the eighth switch being connected to the first node; and
a ninth switch, a first end of the ninth switch being connected to the second bit line, and a second end of the ninth switch being connected to the second node,
wherein in the offset elimination stage of the sense amplifier, both the eighth switch and the ninth switch are open.

7. The sense amplifier of claim 6, wherein after the offset elimination stage of the sense amplifier, a memory cell on the first bit line or a memory cell on the second bit line is enabled, the first switch is open, and the eighth switch and the ninth switch are closed, to input a voltage difference between the first bit line and the second bit line to the sense amplifier.

8. The sense amplifier of claim 7, wherein in a case where the voltage difference between the first bit line and the second bit line is input to the sense amplifier, the source of the first PMOS transistor is connected to the power voltage, and the source of the first NMOS transistor is grounded, to amplify the voltage difference.

9. The sense amplifier of claim 5, further comprising:
a precharge circuit, configured to precharge the first bit line and the second bit line when the sense amplifier is in a precharge stage.

10. The sense amplifier of claim 9, wherein the precharge stage and the offset elimination stage are configured as being performed concurrently.

11. A memory, comprising a sense amplifier, wherein the sense amplifier comprises:
an amplification circuit, configured to read data of a memory cell on a first bit line or a second bit line; and
a first offset voltage storage cell and a second offset voltage storage cell, respectively and electrically connected to the amplification circuit,
wherein in a case where the data in the memory cell on the first bit line is read, in an offset elimination stage of the sense amplifier, the sense amplifier is configured to store an offset voltage of the sense amplifier in the first offset voltage storage cell; and in a case where the data in the memory cell on the second bit line is read, in the offset elimination stage of the sense amplifier, the sense amplifier is configured to store the offset voltage of the sense amplifier in the second offset voltage storage cell,
wherein the amplification circuit comprises:
a first Positive channel Metal Oxide Semiconductor (PMOS) transistor;
a second PMOS transistor, a source of the second PMOS transistor being connected to a source of the first PMOS transistor;
a first Negative channel Metal Oxide Semiconductor (NMOS) transistor, a drain of the first NMOS transistor being connected to a drain of the first PMOS transistor; and
a second NMOS transistor, a drain of the second NMOS transistor being connected to a drain of the second PMOS transistor, and a source of the second NMOS transistor being connected to a source of the first NMOS transistor,
wherein a first end of the first offset voltage storage cell is connected to the drain of the first NMOS transistor, and a second end of the first offset voltage storage cell is connected to a gate of the second NMOS transistor,
wherein a first end of the second offset voltage storage cell is connected to a gate of the first NMOS transistor, and a second end of the second offset voltage storage cell is connected to the drain of the second NMOS transistor, and
wherein in the offset elimination stage of the sense amplifier, the first PMOS transistor and the second PMOS transistor are configured as a current mirror, and the first NMOS transistor and the second NMOS transistor are both configured to be in a diode connection mode.

12. The memory of claim 11, wherein the drain of the first PMOS transistor and the drain of the first NMOS transistor are connected to a first node, and the drain of the second PMOS transistor and the drain of the second NMOS transistor are connected to a second node; and the sense amplifier further comprises:
a first switch, a first end of the first switch being connected to the first node, and a second end of the first switch being connected to the gate of the first NMOS transistor;
a second switch, a first end of the second switch being connected to the second node, and a second end of the second switch being connected to the gate of the second NMOS transistor; and
a third switch, a first end of the third switch being connected to a gate of the first PMOS transistor, and a second end of the third switch being connected to a gate of the second PMOS transistor,
wherein in the offset elimination stage of the sense amplifier, the first switch, the second switch and the third switch are all in a closed state.

13. The memory of claim 12, wherein the sense amplifier further comprises:
a pull-up circuit, configured to control a connection state of the source of the first PMOS transistor with a power voltage in response to a pull-up control signal; and
a pull-down circuit, configured to, in response to a pull-down control signal, control whether the source of the first NMOS transistor is grounded,
wherein in the offset elimination stage of the sense amplifier, the source of the first PMOS transistor is connected to the power voltage, and the source of the first NMOS transistor is grounded.

14. A method for controlling a sense amplifier, the sense amplifier comprising an amplification circuit configured to read data of a memory cell on a first bit line or a second bit line, and a first offset voltage storage cell and a second offset voltage storage cell respectively and electrically connected to the amplification circuit, the method for controlling the sense amplifier comprising:

in a case where the data in the memory cell on the first bit line is read, in an offset elimination stage of the sense amplifier, controlling an offset voltage of the sense amplifier to be stored in the first offset voltage storage cell, to implement offset compensation; and in a case where the data in the memory cell on the second bit line is read, in the offset elimination stage of the sense amplifier, controlling the offset voltage of the sense amplifier to be stored in the second offset voltage storage cell, to implement the offset compensation, wherein the amplification circuit comprises:

a first Positive channel Metal Oxide Semiconductor (PMOS) transistor;

a second PMOS transistor, a source of the second PMOS transistor being connected to a source of the first PMOS transistor;

a first Negative channel Metal Oxide Semiconductor (NMOS) transistor, a drain of the first NMOS transistor being connected to a drain of the first PMOS transistor; and a second NMOS transistor, a drain of the second NMOS transistor being connected to a drain of the second PMOS transistor, and a source of the second NMOS transistor being connected to a source of the first NMOS transistor, wherein a first end of the first offset voltage storage cell is connected to the drain of the first NMOS transistor, and a second end of the first offset voltage storage cell is connected to a gate of the second NMOS transistor, wherein a first end of the second offset voltage storage cell is connected to a gate of the first NMOS transistor, and a second end of the second offset voltage storage cell is connected to the drain of the second NMOS transistor, and wherein in the offset elimination stage of the sense amplifier, the first PMOS transistor and the second PMOS transistor are configured as a current mirror, and the first NMOS transistor and the second NMOS transistor are both configured to be in a diode connection mode.

\* \* \* \* \*